United States Patent [19]

Balousek

[11] Patent Number: 5,801,723
[45] Date of Patent: *Sep. 1, 1998

[54] STREAK DETECTOR FOR INK JET PRINTER

[75] Inventor: Andrew J. Balousek, Berkeley, Mich.

[73] Assignee: Unisys Corp, Blue Bell, Pa.

[*] Notice: The term of this patent shall not extend beyond the expiration date of Pat. No. 5,565,786.

[21] Appl. No.: 760,012

[22] Filed: Dec. 3, 1996

Related U.S. Application Data

[62] Division of Ser. No. 265,054, Jun. 24, 1994, Pat. No. 5,583,546, which is a continuation of Ser. No. 883,620, May 12, 1992, abandoned.

[51] Int. Cl.$^6$ ............................ B41S 2/01; G01N 27/06
[52] U.S. Cl. .......................... 347/19; 324/439; 324/555; 324/718
[58] Field of Search ..................... 347/5–7, 19, 81; 137/551, 553; 174/11 R; 324/524, 555, 556, 691, 693, 713, 718, 439; 340/540, 608, 635, 653, 679

[56] References Cited

U.S. PATENT DOCUMENTS 5,381,099   1/1995   Balousek ........................ 324/555

*Primary Examiner*—Benjamin R. Fuller
*Assistant Examiner*—Craig A. Hallacher
*Attorney, Agent, or Firm*—M. Starr; J. McCormack; N. Coss

[57] ABSTRACT

Disclosed is a combined "streak-detector" and "ink-lever flow detector" on opposite sides of a single printed circuit board; each detector comprising a pair of parallel printed circuit segments adapted to be "shorted" by interposition of conductive ink and coupled to register this event in an associated detect-logic stage.

5 Claims, 5 Drawing Sheets

STREAK DETECTOR FOR INK JET PRINTER

This is a Division of U.S. Ser. No. 08/265,054, filed Jun. 24, 1994, (to issue as U.S. Pat. No. 5,583,546), which is a Continuation of application Ser. No. 07/883,620, filed May 12, 1992 now abandoned.

This invention relates to ink jet printers, and more particularly, to means for detecting error combinations therein, such as "streaking" and/or "overflow".

BACKGROUND FEATURES

Workers in the art of providing and using ink jet printers realize that some error conditions can be very troublesome—one such is "streaking", when one, or several, ink jet nozzles are projecting their ink streams at non-desired (non-printing) times or places, as a document moves past. In a worst case, this can results in a continuous line(s) across the subject document, at times persisting even when the document has passed beyond the print station. Other malfunctions can cause ink jets to be projected before, or after, an entire subject document passes the print station; or to be projected above the document (e.g., when check height is less than "standard") —all such resulting in ink jets projected with no document to intercept them ("bypass streaking"). In other cases a pin hole etc. may exist, or be formed, in a document, allowing an ink jet to be projected through the document ("thru-streaking").

Any, and all, such conditions can be characterized as "streaking", and are troublesome (e.g., often resulting in unacceptable print results, not to mention creating a messy pool of ink on the document transport track, in the printer, etc.) —and are obviously to be avoided or terminated (and corrected) as soon as possible. This invention is directed toward automatically detecting such "streak" conditions and providing resultant indicator signals (e.g., alarm, error-signal to stop printing action).

A typical ink jet printer system consists of 128 tiny individual jet nozzles delivering ink to inscribe a document as it passes by the print head. As mentioned, the possibility of "streak-errors" occurring in the print system calls for failure detection measures. My subject streaker detection system offers a remedy, detecting errors involving erroneous jetting of ink continuously from one or more jet nozzles (i.e., "streaking") —"streaking" being understood to also include jet-ink projected through the document material, (e.g., through a pin-hole, being leaked-through when a check is being printed.)

An object hereof is to address at least some of the foregoing problems and to provide at least some of the mentioned, and other, advantages and features.

BRIEF DESCRIPTION OF THE DRAWINGS

These and other features and advantages of the present invention will be appreciated by workers as they become better understood by reference to the following detailed description of the present preferred embodiments which should be considered in conjunction with the accompanying drawings, wherein like reference symbols denote like elements;

FIG. 5A represents a detect-conductor pattern like that in FIG. 1A while FIGS. 5B, 5C and 5D represent different variations on the pattern in FIG. 5A.

The methods and means discussed herein, will generally be understood as constructed and operating as presently known in the art, except where otherwise specified; likewise all materials, methods, devices and apparatus described herein will be understood as implemented by known expedients according to present good practice.

Figure 3:
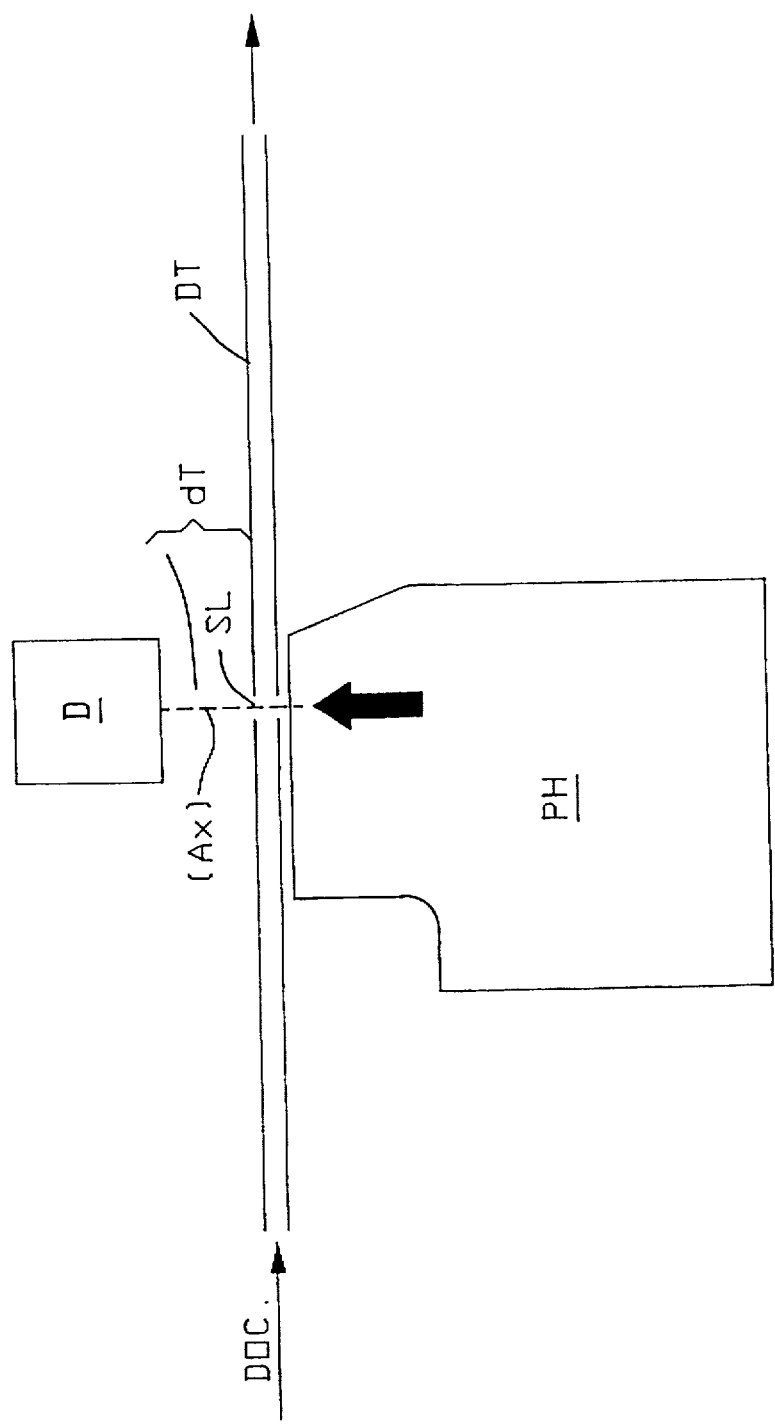
FIG. 3 is a very simple plan view of such a board embodiment as disposed in operative relation with an ink-jet print head and interviewing document transport track.

Embodiment I (FIGS. 1A, 1B,2,3):

FIG. 3 shows a very simplistic schematic plan view of a document transport path (track DT, along which document is translated, e.g., between a pair of track guides as known in the art) past a print station, where an ink jet print head PH will be understood as conventionally arranged and controlled to project one or several jets of conductive ink across the track DT (cf. print-site defined by arrow and dotted line across track DT, with track-guide relieved adjacent PH to allow this). Here, one may assume that documents are continuously translated past PH at about 300 in/sec or less.

According to a feature hereof, a slit SL is provided in the track guide opposite PH (e.g., preferably about 100–150 mils wide) to allow the multi-jet train (along common jet-axis Ax) to project beyond track DT when no document is interposed. According to a related feature, a "streak-detector" D is also provided to intercept this jet train (Ax)—e.g., about one inch past track DT.

Figure 1B:
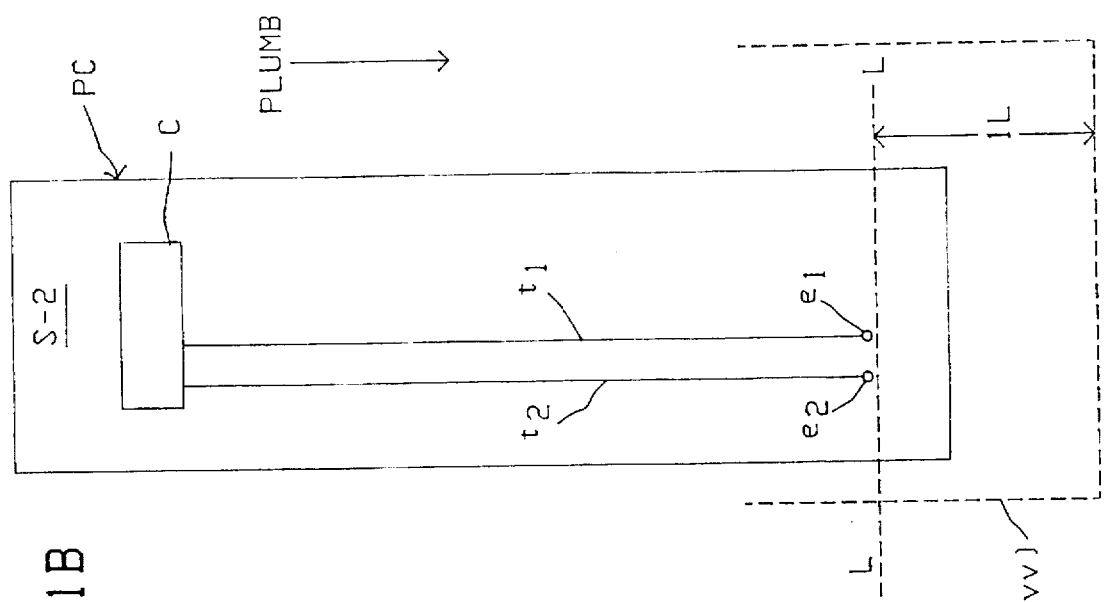
FIG. 1A is a frontal schematic showing of a "streak-detecting circuit board embodiment, with FIG. 1B a like showing of the rear-side thereof.
Figure 1A:
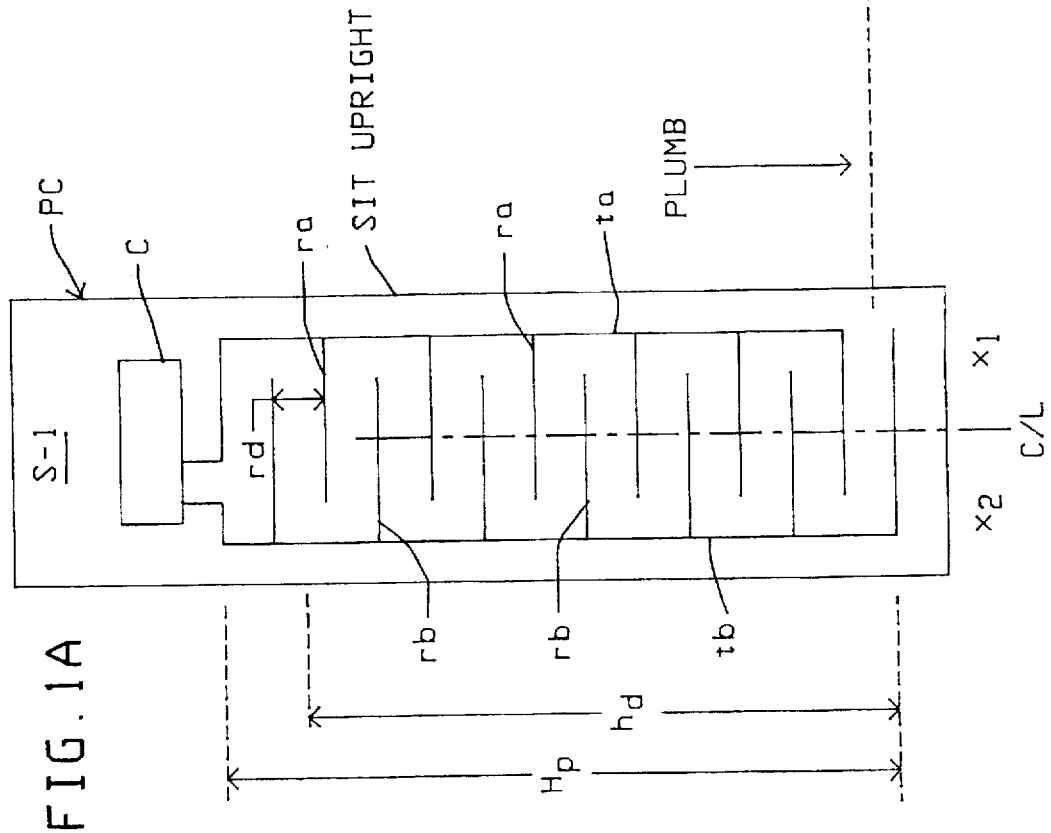

FIG. 1A shows, in schematic front elevation, a proposed streak detecting embodiment circuit board PC, for detector D, presenting an array of spaced "horizontal" conductors (aligned transverse to "PLUMB" direction) adapted to intercept the ink stream projected past a document (i.e., along Ax) by (one or more) "streaking" (e.g. plugged) jets and to automatically provide output(s) to signal such malfunctions.

More particularly, the "front side" S-1 of board PC will be understood as preferably provided with a pair of interleaved "ladder" conductors (cf. +half-ladder $t_a$ and opposed minus half-ladder $t_b$), these being disposed to intercept all the streaking ink jets of a subject print head PH; e.g., side S-1 being positioned opposite head PH, and beyond the intervening document transport track DT. Typically, slit SL will be cut into the track-guide de defining the side of track DT opposite the ink jet orifices (so all jets will pass therethrough if activated without an intervening document). Board PC is placed across slit SL (e.g., about 1" beyond), with front side S-1 relatively vertical and facing head PH, side S-1 having its ladder pattern positioned to intercept all jets; (with its center line C/L aligned with the jet paths, or axis Ax, the pattern height hp spanning the "throw" of all jets, with some leeway on each side of the C/L, as at $x_1$, $x_2$). The horizontal "rungs" of each half-ladder $t_a$, $t_b$ will preferably be identical, and spaced a prescribed varying separation rd from adjacent opposing rungs.

As workers can visualize, a streaking ink jet (e.g., firing its conductive stream erroneously when no document intervenes—remember the subject ink must be at least somewhat conductive)_, will pass through slit SL and strike the ladder pattern at some respective height thereon, approximately along axis C/L, Ax. The ladder pattern is arranged so that a substantial blob of this conductive ink will rather quickly flow down, gravity-urged (in PLUMB direction; assume documents advanced along DT relatively "horizontal", or normal to "PLUMB"), to span at least two opposing opposed-potential rungs (e.g. well before the ink can run-off or dry) and so cause conduction (a "short") between the half-ladder patterns, causing an associated detect stage C coupled thereto, to register this and provide related output (e.g., as detailed below re FIG. 2 circuit).

Preferably, the ladder patterns $t_a$, $t_b$, each comprise like bare conductor traces (e.g. prefer tinned copper about—?-wide, printed on board PC as well known in the art) as the detect-array so that, when the conductive ink flows to make contact between rung traces, the detection circuitry can register this. The detection circuitry senses the presence (or absence) of the fluid and generates a corresponding logic signal, as known in the art.

As stated, the opposed-rung-separation distance, rd, is preferably varied here; principally to reduce sensitivity to ink-impact when "under-height" documents are being printed. Thus, if a certain "standard" document height Hd is assumed (see FIG. 1A), then an under-height document might allow the "upper" ink jets (above Hd) to impact board face S-1 at the upper portion of the ladder pattern and "erroneously" indicate "streaking". To reduce the likelihood of this, the upper rungs can be separated enough (e.g., here about 300 mils—vs 200 mils for "lower" rungs) to reduce/eliminate detection sensitivity; thus, the detect logic can be arranged to discriminate between an "only-upper" short condition and other short conditions, as known in the art.

Figure 5:
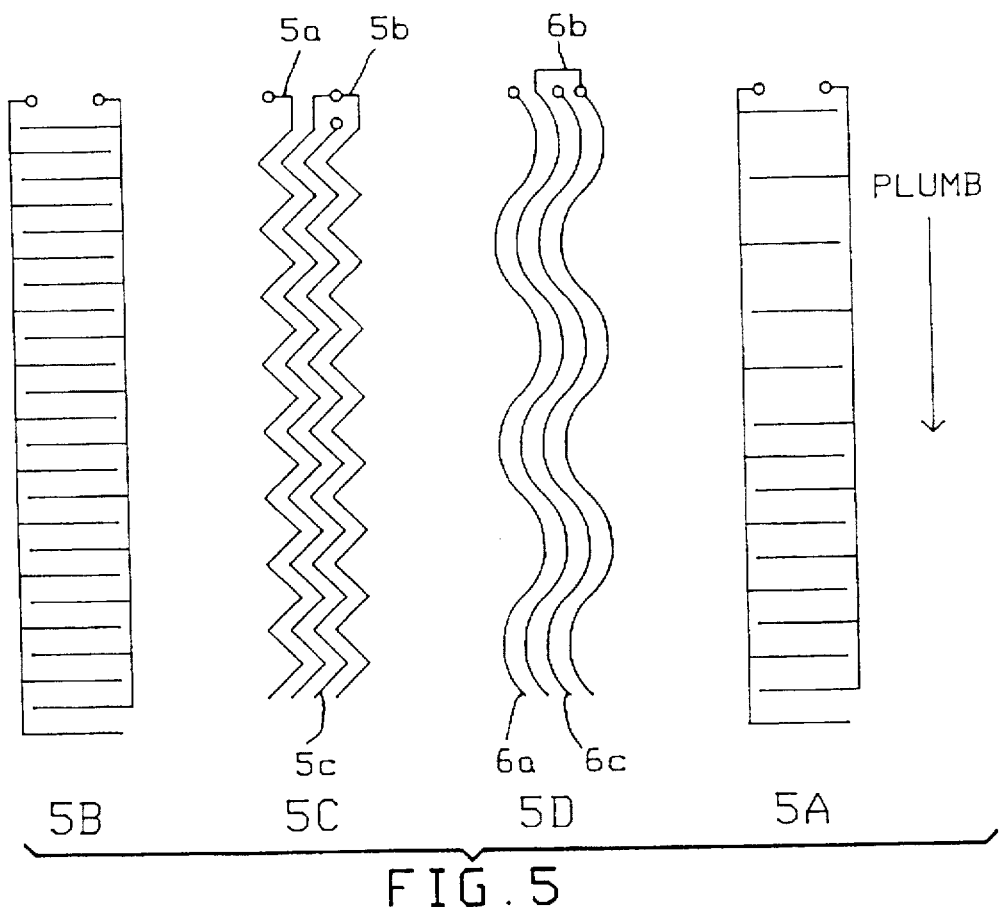

The pattern of these bare traces is preferably the "opposed, interleaved rungs" of two half-ladders as above mentioned (and shown in FIG. 1A); although variations are feasible in some cases; e.g. as depicted in FIGS. 5B, 5C, 5D, described below.

FIG. 5A depicts a printed circuit pattern of this ladder type (as FIG. 1A), where the "upper" rung-separation is about 300 mils and the "lower" about 200 mils. This, evidently, can give a two fold height-discrimination capability to the detector system—e.g., so the output indicating "streaking" must traverse 300 mil rung separation—e.g. assume here that ink will dry before completing this drip-distance. Alternatively, timer/filter means may be used (e.g. see FIG. 2, described below) to tell whether shorting ink has traveled 200 mils or less, vs 300 mils or more. As workers will appreciate, in certain cases, one may even make a 3-fold (or 4-fold, etc.) discrimination, using three different rung separation.

By contrast, FIG. 5B depicts another "ladder" pattern where the inter-rung separation is made uniform (not varying as in FIGS. 1A, 5A); this can be satisfactory where no "height-discrimination" is wanted (vs the FIG. 1A, FIG. 5A embodiments).

Also, detect sensitivity, in general, may be controlled by varying the inter-rung separation, rd; e.g., we have found that for arrangements as described above, a separation rd of about 50 mils or less gives too high a sensitivity (e.g., shorts from tiny ink filaments, or even moisture deposits); whereas about 350+ mils or more makes sensitivity too low; thus, we prefer the mentioned 200 mil (±20%) rung-separation for most uses of the sort described.

In any event, the opposed conductors (rung-traces) of this "streak detector" will be arranged in a pattern so that when sufficient flowing ink provides a conductive path (sufficient rise in conductivity) between two opposite-polarity rung-traces, the detection circuitry will sense any such short. The traces on the front side s-1 of circuit board PC face print head PH to accommodate this detection of "streakers".

The configuration of the pattern and the opposed-conductor separation distance (e.g., rd, FIG. 1A) will, of course, determine the "sensitivity" of streak detection. For instance, assuming a certain machine environment and document type (e.g., here, assume a check-sorter printer like the Unisys DP-1800 moving checks past the print station at about 1800 checks/min, and using a ink jet printer with a print head about 1.25" high containing about 128 separate ink jet nozzles; each nozzle about 2 mils in diameter, with a 10 mil jet separation), one will prefer a "ladder" pattern like that in FIG. 1A. One should set rung separation (rd) large enough to avoid "accidental shorts" (e.g., from a random speck of dust; here, more than about 10–50 mils is advised; and small enough to give reasonably high sensitivity (e.g., allow sufficient ink mass to flow, without drying, to give sufficient inter-rung conduction, here, less than about one-half inch is advised). With this embodiment, a separation rd of about 100–250 mils has been found reasonably satisfactory. [assume a ladder height hp of about 1.5" or more? with about one-half inch $(x_1, x_2)$ rung-spread on either side of center line C/L.]

Other Streak-Conductor Patterns:

Evidently, whatever streak-conductor pattern is used, it should present opposed pairs of conductors across the target jet axis to be able to intercept such erroneously-projected ink blobs when they drip down under gravity. In cases like those above described (jets across horizontal document track) this means horizontally-disposed conductor segments, like the opposed rungs in FIG. 1A—not "vertical" as in FIG. 4.

Figure 4:
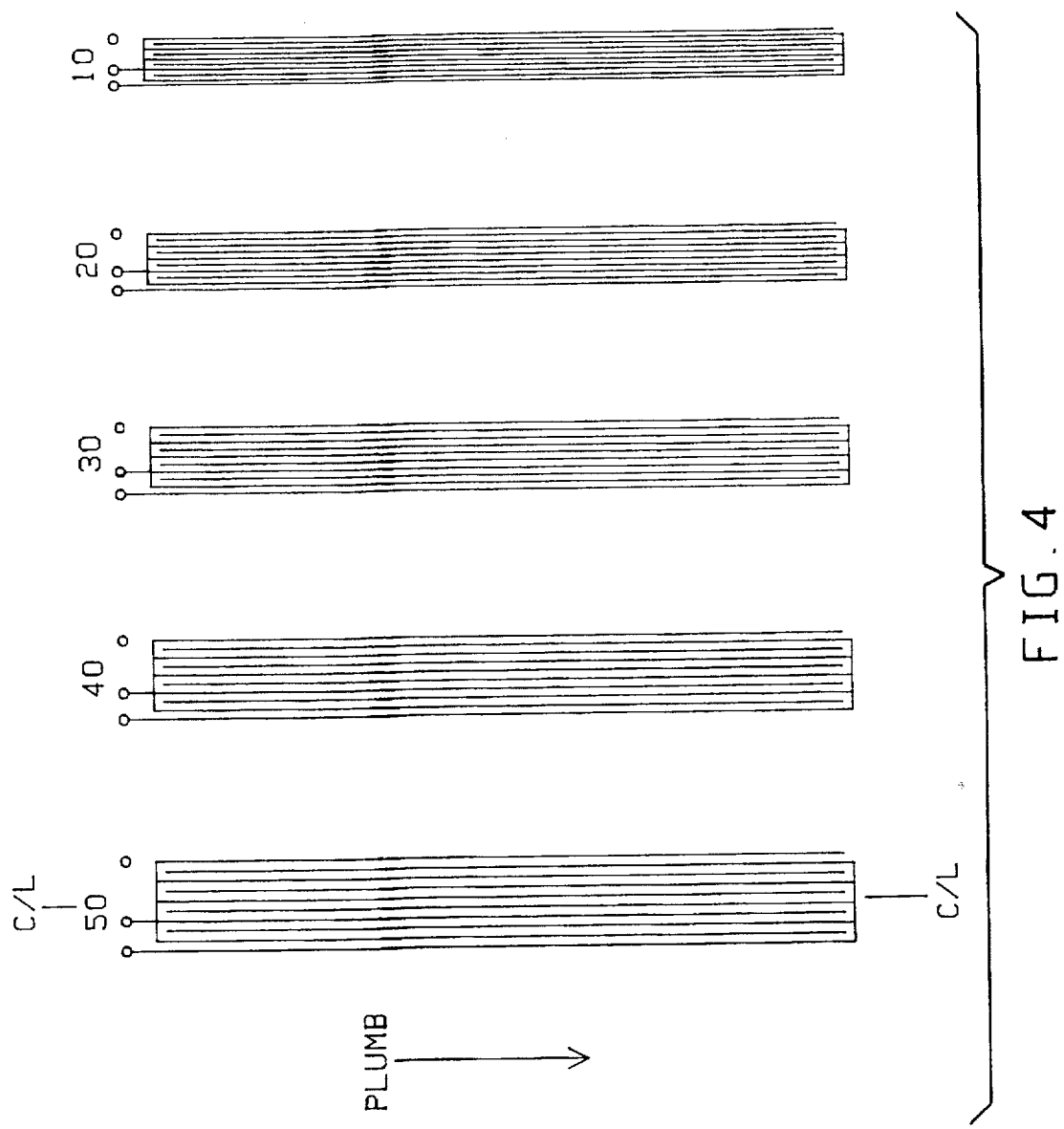
FIG. 4 represents five like printed-circuit versions of a detect-conductor pattern like that of FIG. 1A, but rotated 90°, to be vertical.

FIG. 4 represents five (5) sets of vertically-aligned (parallel to "PLUMB") opposed conductors, spaced (in opposition) at varying separation distances dd—i.e. 50, 40, 30, 20 and 10 mils apart, and aligned with the center-line of the multi-jet ink paths (C/L, as in FIG. 1A). In none of these cases was effective, adequate streak detection ("short-incidence") achieved.

FIGS. 5C,5D represent "sinuous" patterns of "oblique" detect-conductors (e.g., segments oblique to jet axis C/L, vs horizontal "ladder" patterns of FIGS. 1A, 5A or 5B).

FIG. 5C represents a modified streak-detector pattern of opposed "zig-zag" conductors; i.e., a like parallel, spaced pair of "plus-conductors 5-b, connected in common (e.g., to +V) each flanked by a like zig-zag "minus-conductor" 5-a, 5-c (e.g., both connected to −V).

FIG. 5D represents an oblique, curved, sinuous variation of the pattern in FIG. 5C, wherein a pair of like, parallel, spaced, sinuously-curved conductors 6-b are connected in common (e.g., to +V), each flanked by a like parallel, sinuous "minus-conductor", 6-a, 6-c (e.g., both connected to −V).

Figure 6:
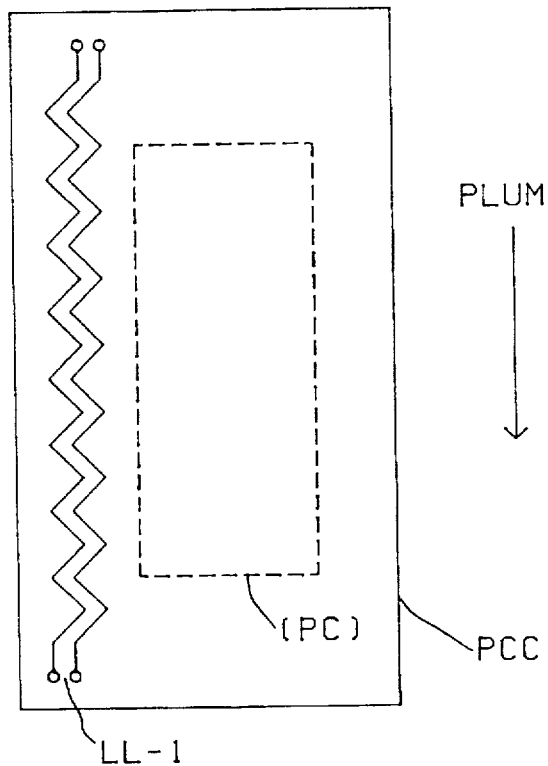
FIG. 6 represents another detect-circuit board embodiment with a set of sinuous detect-conductors flanking the streak-detect conductors of FIG. 1A, and apt for detecting "off-center" ink jets.

Off-Center Detector, FIG. 6:

FIG. 6, represents a larger PC board PCC, on which the elements of board PC (as in FIG. 1A) are centrally placed (in phantom, i.e., two half-ladders, plus logic C etc.), and are surrounded by a board expanse, PCC on which is placed another set of two half-ladders LL-1 (e.g., like that in FIG.5B), disposed to the left of PC, to detect when/if one or more jet streams wanders sidewise to "short" half-ladders LL-1. Another such array may be placed to the right of PC, another below and another above Detect Circuit:

Workers will understand various ways wherein the streak-detect output (short-occurrence) may be detected and registered (e.g., used to control ink-jet printer, document transport, etc.). One preferred form of detect circuit is given in FIG. 2 [here, combined with other circuits; e.g., for "overflow" detection].

Figure 2:
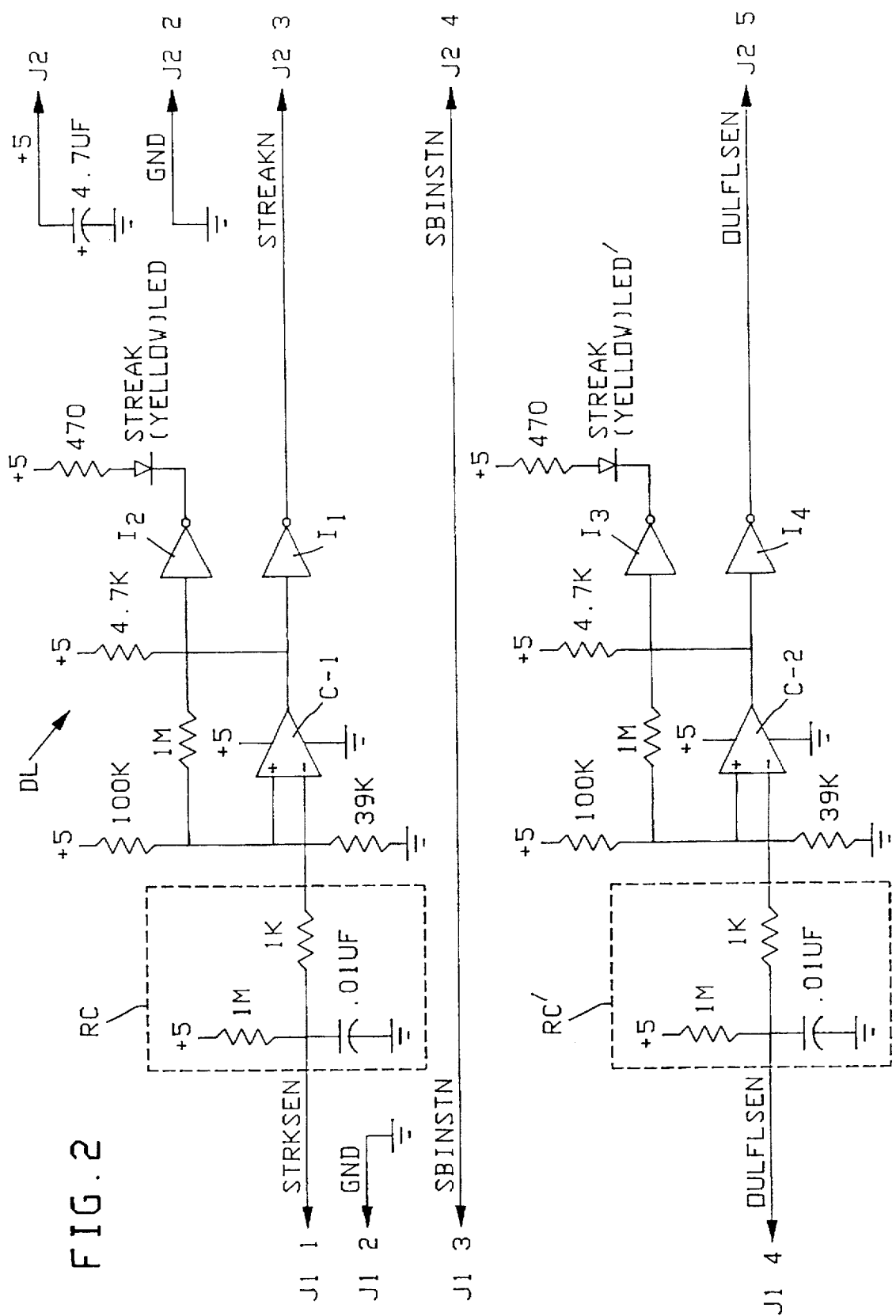
FIG. 2 is a schematic detect logic circuit embodiment, apt for use with this circuit board.

In FIG. 2, the INPUT/OUTPUT signals are arranged as follows:

INPUT signals (on left, all "J1"):

J1-1: from streak-detector, indicating "streak" (short between ladder-rungs) if "sufficient" drop in resistivity to "unbalance" comparator stage C-1 ("STRKSEN");

J1-2: Ground; and to interface with printer.

J1-3: to PR interface, signal (SBINSTN, or "Hi") indicates that detector PC board is properly installed and working.

J1-4: signal from overflow-detect (pr. ckt) conductors indicates "overflow level" if sufficient drop in resistivity to "unbalance comparator stage C-2 (i.e. "Hi", or OVFLSEN).

Output (all "J2" terminals):

J2-1: Power to PC board

J2-2: Ground; in common with J1-2 and PR interface.

J2-3: "Streak-detected" ("STREAKN", or "Lo" signal as explained below ("Hi" indicates "No streak").

J2-4: "Hi" indicates "PC board installed", as at J1-3; but "Lo" indicates "Not installed".

J2-5: "OVFLOWN" (or "Lo") indicates "Overflow" condition—but "Hi" indicates "No overflow", as explained below.

Operation:

Typical operation of this embodiment (FIG. 1A ladder with FIG. 2 circuit) would be as follows.

A "significant" streak-condition occurs, leading to a serious "short" between opposed ladder rungs, with a large blob of conductive ink dropping inter-rung conductivity radically and developing a streak-sensing condition ("STRKSEN" or low-resistance path to ground at J1-1) to an associated pin 74 of a comparator stage C-1. Comparator C-1 constantly compares the input on its pin #4 to that on pin #5: normally they are approximately equal, but a streak-caused "short" (e.g. to ground) will drop the pin #4 input low enough (compared with the pin #5, "reference input") to unbalance C-1, whereupon C-1 will issue a "High" output to invertor $I_1$, and thence a "low" to output pin J2-3 ("STREAKN"). This output ("STREAKN") is applied to the printer control and associated software to register this error (Streak) condition, whereupon an appropriate response is automatically invoked (e.g. printer stopped; indicator to operator; head-clean cycle invoked, e.g. to remove dirt etc. in jet nozzle; —recurrence of streak condition may invoke replacement of print head).

Comparator stage C-1 preferably comprises an LM-339 type comparator or the like, plus associated circuitry. C-1 inputs #4, #5 may be set to a "normal" reference voltage (e.g. about 3.5–4 volts, set by +5 v terminal as adjusted by impedance network, as known-in the art). Varying this reference input to pin 5 can vary sensitivity (i.e., threshold). When C-1 is unbalanced by a streak-short, its output goes "High" to indicate "streak" and is inverted at $I_1$, then, as "low" passed to output at J2-3. Preferably, an input circuit R-C is also used to filter out low-level input on J1-1 (e.g. noise spike or like minor drop in resistance, e.g. from tiny trickle of ink or moisture between rungs, not amounting to a full-fledged "streak condition", as here defined). Here, such a "noise" condition might drop the pin #4 input from about 4 v to about 3.5 v; versus about 0.8–1.2 v or less for a true "streak" condition.

This "STREAKN" output ("LOW", or less than 2–3 v on pin J2-3) will persist, of course, until there is too little conductive ink between rungs to sufficiently drop pin #4 input (e.g. ink dries or runs off), whereupon C-1 will again be "balanced" and J2-3 output revert to "high".

Preferably, the C-1 output is also used to activate an "internal streak-indicator", such as the Yellow LED of FIG. 2. This indicator may be useful where the system indicates "Streak", but an operator wants to double-check to see whether intra-machine error caused this; so inspection of the detect circuit unit would show the Yellow LED lit, indicating that a genuine "streak condition" likely occurred. Such can also be done during Test/Set-up where a blob of conductive test-ink is placed between rungs.

Proper installation of the PC Board (PC, FIGS. 1A, 1B) is indicated by an associated signal, "SBINSTN", (or "High") on pin J1-3, coupled to output (e.g. to print control) via pin J2-4.

Overflow Operation:

Typical operation of the "overflow" detector embodiment (e.g. see FIG. 1B) is, according to an enhancement feature, parallel to the streak detector (FIG. 1A) and uses like conductors on the reverse side of board PC, along with similar detect circuitry.

Here, a comparator stage C-2, like C-1 above is similarly set to normally compare the "overflow" input (on J1-4 to Din 6) with a reference input (pin 7, see +5 v supply). When a true overflow condition occurs ("OVFLSEN" on J1-4), the pin 6 input will drop radically (overflow shorting to GND, between conductors in FIG. 1B), causing a "High" output from C-2, this being inverted (at $I_4$) to appear as a "Low" output on J2-5. This output also activates a Red LED as before, and is noise-filtered by an associated R-C input circuit (RC') as before. Either R-C input network can obviously be used to adjust detector-sensitivity (i.e. lower threshold), as known in the art. The overflow-detecting output (on J2-5) is preferably used to automatically shut down the printer PR, since it indicates a condition that can be very dangerous (e.g. causing short, possibly fire inside machine) and hazardous to machine operation.

According to a related feature, "hypersensitivity" (e.g., "accidental shorts", such as from an ultra-brief jet-burst, not amounting to a genuine "streak" condition) can be compensated for, if not actually prevented, by arranging for detect stage C, and associated controlling software, to require that a streak-indicating pulse S-S from the ladder pattern (e.g., to J-11, FIG. 2) must persist beyond a prescribed minimum time $t_d$ (e.g., using a delay network or a pulse-width filter) and/or to require (logic) that such a pulse be present when sampled-for again after a prescribed interval $t_c$ (e.g., 5 seconds has been found suitable), as workers will understand.

Collection of streak-ink:

As depicted schematically in FIGS. 1A, 1B, any jet ink passing through slit SL (e.g., that strikes the front S-1 of board PC in FIG. 1A) is preferably collected in a sump-vessel VV [same vessel under document print-station; see FIG. 1B] and be periodically emptied therefrom. As workers realize, it will be a convenience for an operator to be automatically reminded that sump vessel VV needs to be emptied (i.e., is "too full"). For this purpose, I prefer to provide a "sump-full" detector on the rear-face of the streak-detect board (e.g., PC above), so that the board may be placed (suspended) in vessel V whereby rising of sump contents (conductive ink from jets) above a test-level L—L will cause the sump-full detector to automatically indicate such.

FIG. 1B shows a preferred embodiment of such a detector, comprising a pair of rectilinear parallel overflow-conductors $t_1$, $t_2$, (pref. copper traces printed upon 5-2 of PC board, as for half-ladders $t_a$, $t_b$) input to detect-logic stage C, with both conductors terminated to define a prescribed "sump-full" level (see L—L, FIG. 1B—this level L—L being kept low enough that it not short-out any opposed-rungs (streak-detector) on the opposite face S-1—see FIG. 1A, and level L—L). Conductors $t_1$, $t_2$ will preferably be uniformly separated with like terminal tabs $e_1$, $e_2$ being provided on each.

Detect circuitry in detect logic stage C (FIG. 2 is example) will sense the presence (absence) of sump-fluid above level L—L as before described, or otherwise as known in the art (cf. onset of signal indicating conduction from $t_1$, to $t_2$ via conductive ink level in vessel VV); e.g., indicating over-accumulation of ink in housing of detector, and well before risk of "overflow". Thus, detect-traces $t_1$, $t_2$ are configured and separated so that when the fluid level of the ink rises to electrically couple the traces, a "sump-full" condition is automatically detected and registered. The height of the traces from the bottom of the circuit board affect the level of detection.

In conclusion, it will be understood that the preferred embodiments described herein are only exemplary, and that the invention is capable of many modifications and variations in construction, arrangement and use without departing from the spirit of the claims.

For example, the means and methods disclosed herein are also applicable to other related document print systems. Also, the present invention is applicable for enhancing other ways of using conductive fluid and related arrangements.

The above examples of possible variations of the present invention are merely illustrative. Accordingly, the present invention is to be considered as including all possible modifications and variations coming within the scope of the invention as defined by the appended claims.

What is claimed is:

1. Apparatus for detecting streaking and other erroneous print operations by a malfunctioning ink jet in a jet printing arrangement arranged to project one or more jets of conductive ink droplets along a prescribed locus of jet axes, onto selected portions of a subject document, the document being transported along a transport path past said axis, said apparatus comprising: non-conductive substrate means for supporting conductor segments disposed in line with said locus, behind said path of a subject passing document; at least one pair of spaced conductor segments disposed on a first surface of said substrate means, opposite said jets to intersect all said jet axes, and beyond said transport path therefrom, said segments being spaced and arranged so that opposed portions thereof will intercept droplets resulting from said erroneous operations of said jets and will be ohmically connected thereby; and detect means coupled to said pairs of segments to detect and register the ohmic connection thereof by a said malfunctioning jet, and so indicate said malfunctioning; said detect means being arranged to include means for filtering brief bridging pulses such as pulse spikes.

2. Apparatus for detecting streaking and like erroneous fluid projection on any arrangement adapted to project one or more conductive fluid streams along prescribed stream axes onto selected portions of a subject target, said apparatus comprising: non-conductive substrate means positioned in line with said stream axes, behind the position of the subject target and spaced therefrom, said substrate means being adapted to intercept fluid that misses said target; at least one pair of spaced conductor segments disposed on a first surface of said substrate opposite said streams to intersect all said stream axes, said segments being arranged and adapted so that opposed portions thereof will intercept said streaking and like erroneous fluid projection and be ohmically connected thereby when the conductive fluid is gravity-urged down said first surface; detection means coupled to said pairs of segments to detect and register the ohmic connection of said segments resultant from said streaking and like erroneous fluid projection; said detect means being arranged to include means for filtering out brief bridging pulses; plus means for indicating said streaking and like erroneous fluid projection.

3. Apparatus for detecting streaking and other erroneous print operations by an ink jet printing arrangement arranged to project one or more jets of conductive ink droplets along a prescribed locus of jet axes, onto selected portions of a subject article, the article being transported along a transport path past said locus;

said apparatus comprising: non-conductive substrate means positioned for supporting conductor segments in line with said locus, beyond said path; at least one pair of spaced conductor segments placed on a first surface of said substrate means to face said jets and intersect all said jet axes, said segments being arranged so that opposed portions thereof will intercept results of said erroneous print operations and be ohmically connected thereby when conductive fluid from a droplet intercepted by said substrate means is gravity-urged to drip down said surface; and detect means coupled to said pairs of segments to detect and register the ohmic connection thereof by said dripping fluid from said erroneous print operations, while being arranged to include means for filtering out brief "bridging pulses" that do not indicate said erroneous print operations.

4. The apparatus of claim 3, wherein said means for filtering comprises R-C circuit means.

5. A method of detecting streaking and other erroneous print operations by an ink jet printing arrangement arranged to project one or more jets of conductive ink droplets having a certain minimum diameter along a prescribed locus of jet axes, onto selected portion of a subject article, the article being transported along a transport path past said locus, said method comprising the sets of: placing non-conductive substrate means for supporting conductor segments in line with said locus, beyond said path; disposing at least one pair of spaced conductor segments on a first surface of said substrate means facing said jets to intersect all said jet axes, and beyond said transport path therefrom, said segments being spaced apart more than the minimum diameter of said ink droplets and arranged so that opposed portion thereof will intercept results of said erroneous print operations and be ohmically connected thereby when conductive fluid from a droplet intercepted by said substrate means is gravity-urged down said surface; and coupling detect means to said pairs of segments to detect and register the ohmic connection thereof by said fluid from said erroneous print operations, while arranging said detect means to include means for filtering out brief bridging pulses.

* * * * *